(12) United States Patent
Jin et al.

(10) Patent No.: US 12,379,408 B2
(45) Date of Patent: Aug. 5, 2025

(54) DEVICE AND METHODS FOR PHASE NOISE MEASUREMENT

(71) Applicant: Microchip Technology Incorporated, Chandler, AZ (US)

(72) Inventors: Gary Qu Jin, Kanata (CA); Chris du Quesnay, Ottawa (CA); Ehsan Rahimi, Ottawa (CA)

(73) Assignee: Microchip Technology Incorporated, Chandler, AZ (US)

( * ) Notice: Subject to any disclaimer, the term of this patent is extended or adjusted under 35 U.S.C. 154(b) by 389 days.

(21) Appl. No.: 17/952,535

(22) Filed: Sep. 26, 2022

(65) Prior Publication Data

US 2023/0393184 A1    Dec. 7, 2023

Related U.S. Application Data

(60) Provisional application No. 63/348,397, filed on Jun. 2, 2022.

(51) Int. Cl.
G01R 29/26    (2006.01)

(52) U.S. Cl.
CPC .................................. G01R 29/26 (2013.01)

(58) Field of Classification Search
CPC ...................................... G01R 29/26
See application file for complete search history.

(56) References Cited

U.S. PATENT DOCUMENTS

| | | | |
|---|---|---|---|
| 3,875,328 A * | 4/1975 | Gibson | H04N 17/00 |
| | | | 455/226.4 |
| 4,654,861 A * | 3/1987 | Godard | H04L 1/205 |
| | | | 379/27.08 |
| 7,239,969 B2 | 7/2007 | Tabatabaei et al. | 702/69 |
| 8,965,727 B2 | 2/2015 | Rzyski | 702/111 |
| 2010/0183164 A1* | 7/2010 | Elmedyb | H04R 25/453 |
| | | | 381/71.8 |
| 2011/0150257 A1* | 6/2011 | Jensen | H04R 25/453 |
| | | | 381/318 |
| 2017/0236526 A1 | 8/2017 | Choo et al. | |

OTHER PUBLICATIONS

Rubiola, Enrico, "Correlation-Based Phase Noise Measurements," Review of Scientific Instruments, vol. 71, No. 8, pp. 3085-3091, Aug. 1, 2000.
Liao, Fang-Ren et al., "A Waveform-Dependent Phase-Noise Analysis for Edge-Combining DLL Frequency Multipliers," IEEE Transactions on Microwave Theory and Techniques, vol. 60, No. 4, pp. 1086-1096, Apr. 1, 2012.
International Search Report and Written Opinion, Application No. PCT/US2022/051211, 11 pages, Apr. 12, 2023.

* cited by examiner

*Primary Examiner* — Elias Desta
(74) *Attorney, Agent, or Firm* — SLAYDEN GRUBERT BEARD PLLC

(57) ABSTRACT

A device for measuring phase noise, including a sampler to sample an input signal, an input filter to receive an input from the sampler, a noise generator to generate a noise signal, a combiner to receive input from, respectively, the input filter and the noise generator, the combiner to output an integrated noise output measurement. The input filter may operate in either the time domain or the frequency domain. The noise generate may generate a noise signal based on the sampler output, or may generate a noise estimate value based on the sampler output.

31 Claims, 8 Drawing Sheets

DEVICE AND METHODS FOR PHASE NOISE MEASUREMENT

RELATED PATENT APPLICATION

This application claims priority to commonly owned U.S. Patent Application No. 63/348,397 filed Jun. 2, 2022, the entire contents of which are hereby incorporated by reference for all purposes.

TECHNICAL FIELD

The present disclosure relates to a device and method for measuring phase noise through a communication channel.

BACKGROUND

In a digital communication channel, a clock signal includes a noise component which is generally referred to herein as phase noise. This phase noise will be propagated through the communication channel H(s). The communication channel may modify the frequency content of the phase noise. This communication channel could be known or unknown. The phase noise at the receiver end (after the communication channel) may be modified by the communication channel and have a different frequency spectrum than the original phase noise. Different communication protocols may impose different requirements on clock phase noise. In order to ensure compliance with communications standards, it is important to accurately measure phase noise at the receiver end.

In one method for measuring phase noise in a digital communication channel, a clock signal may be sampled to obtain digital samples of the clock signal. The phase noise may be contained in the digital samples of the clock signal. The sampling may be performed in the time domain and a time to frequency transformer may transform the time domain sample into frequency domain. The frequency domain signal may be passed through a communication channel, either a physical channel or a model, to produce an output that includes the impact of the channel on the phase noise of the clock signal. The output of this channel will also include frequency spurs introduced by the sampling of the clock signal.

One complication in measuring phase noise of the clock signal at the receiver end is that the bandwidth of the channel may exceed the clock signal sampling rate. For phase noise below one-half the sample rate of the sampling operation, a simple noise integration may be performed to calculate the phase noise. But for frequencies above one-half the sample rate of the clock signal, existing solutions may use a spectrum extension method or other method of estimating the high frequency content. Spectrum extension may be performed using a technique including but not limited to spectral replication or folding, harmonic replication, neural-network training model, pitch adaptive modulation or Hidden Markov Model (HMM). These estimates may be impacted by spur frequencies introduced by the sampling operation. In addition, spectrum extension will be of limited accuracy because spectrum extension may include assumptions of how to estimate the higher frequency content, which assumptions may not be 100% accurate. In addition, the out-of-band noise may be unpredictable and any spectrum extension will introduce error.

There is a need for an improved measurement of the phase noise in clock signals used in a communication system.

SUMMARY

According to one aspect, there is provided a device for measuring phase noise, including a sampler to sample an input signal, an input filter to receive an input from the sampler, a noise generator to generate a noise signal, a combiner to receive input from, respectively, the input filter and the noise generator, the combiner to output an integrated noise output measurement.

An aspect provides a device for measuring phase noise including a time-to-frequency domain transformer to receive the sampled input signal and to generate a first and a second output signal at least partly as a result of the received sampled input signal, a first communication channel to receive the first output signal from the time-to-frequency domain transformer, a low-pass filter to receive an output signal from the first channel communication channel, a spur suppression filter to receive an output signal from the low-pass filter, the spur suppression filter to output a signal to the combiner.

An aspect provides a device for measuring phase noise including a noise spectrum generator to receive the second output signal from the time-to-frequency domain transformer, a second communication channel to receive an output from the noise spectrum generator, a high-pass filter to receive an output from the second communication channel, the high-pass filter to output a signal to the combiner.

According to another aspect, there is provided a method for measuring phase noise including sampling an input signal to generate a sampled input signal, filtering the sampled input signal to generate a filtered input signal, generating a noise signal, and combining the filtered input signal and the noise signal to generate an integrated noise output.

An aspect provides a method for measuring phase noise including transforming the sampled input signal from the time domain to the frequency domain thereby generating a frequency domain representation of the sampled input signal, passing the frequency domain representation of the sampled input signal through a first communication channel, filtering the output of the first communication channel with a low-pass filter to generate a low-frequency filtered signal, and suppressing spurs in the low-frequency filtered signal with a spur suppression filter[;].

An aspect provides a method for measuring phase noise including generating a noise signal, based at least partly on the frequency domain representation of the sampled input signal, passing the frequency domain representation of the sampled input signal through a second communication channel, and filtering the output of the second communication channel with a high-pass filter to generate a high-frequency filtered signal,

BRIEF DESCRIPTION OF THE FIGURES

The figures illustrate example circuits and systems for measurement of phase noise.

DESCRIPTION

Figure 1:
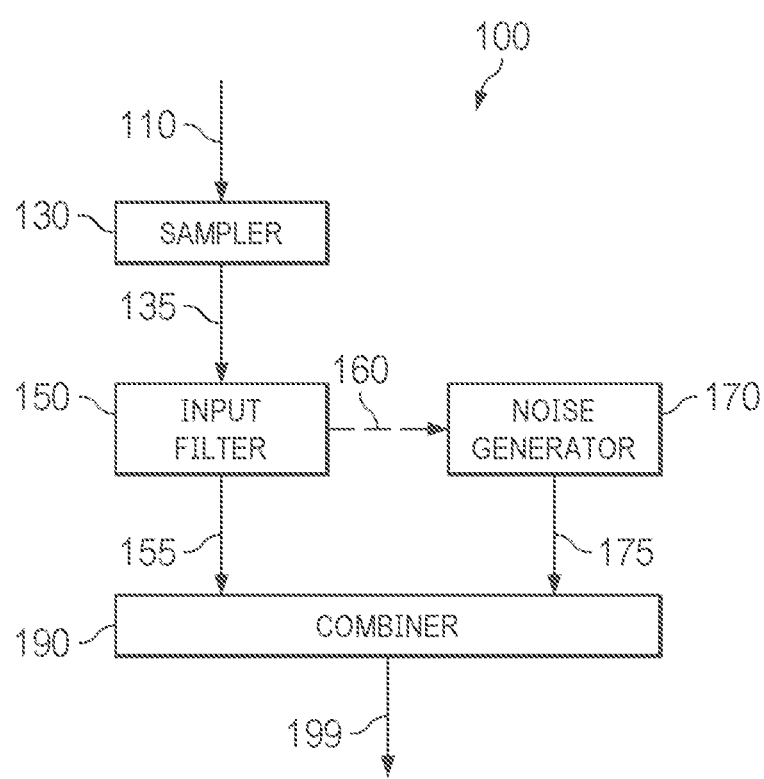
FIG. 1 illustrates a device for measuring phase noise of an input clock.

FIG. 1 illustrates one of various examples of a device for measurement of phase noise. Device 100 may be a digital signal processor (DSP) where individual components of FIG. 1 may represent specific functions implemented on the DSP. Device 100 may be a microcontroller where individual components of FIG. 1 may represent specific functions implemented on the microcontroller. Device 100 may be a field-programmable gate array (FPGA) where individual components of FIG. 1 may represent specific functions implemented on the FPGA. Device 100 may be a combination of multiple individual computational elements which in combination form the device illustrated in FIG. 1. Device 100 may include a clock input 110. Clock input 110 may receive a clock signal from a phase-locked loop (PLL), delay-locked loop (DLL), or other clock source. Clock input 110 may be sampled by sampler 130. The output of sampler 130 may be sampled clock signal 135. Sampled clock signal 135 may be input to input filter 150. Input filter 150 may include multiple computational blocks to filter sampled clock signal 135. Computational blocks may include but are not limited to low-pass filters, communication channels, band-pass filters, high-pass filters, spur suppression filters, noise generators, equalizers and transforms.

Input filter 150 may provide a filtered output 155 to combiner 190. Input filter 150 may optionally provide an output 160 to noise generator 170. Noise generator 170 may include one or more computational blocks to compute a noise signal. Noise generator 170 may include other computational blocks, including but not limited to low-pass filters, communication channels, band-pass filters, high-pass filters, spur suppression filters, equalizers and transforms. Noise generator 170 may provide noise output 175 to combiner 190. Combiner 190 may combine filtered output 155 and noise output 175 using one of various methods. Combiner 190 may include adders, integrators, multipliers and other computational blocks to combine filtered output 155 and noise output 175. Combiner 190 may output an integrated phase noise measurement 199.

Figure 2:
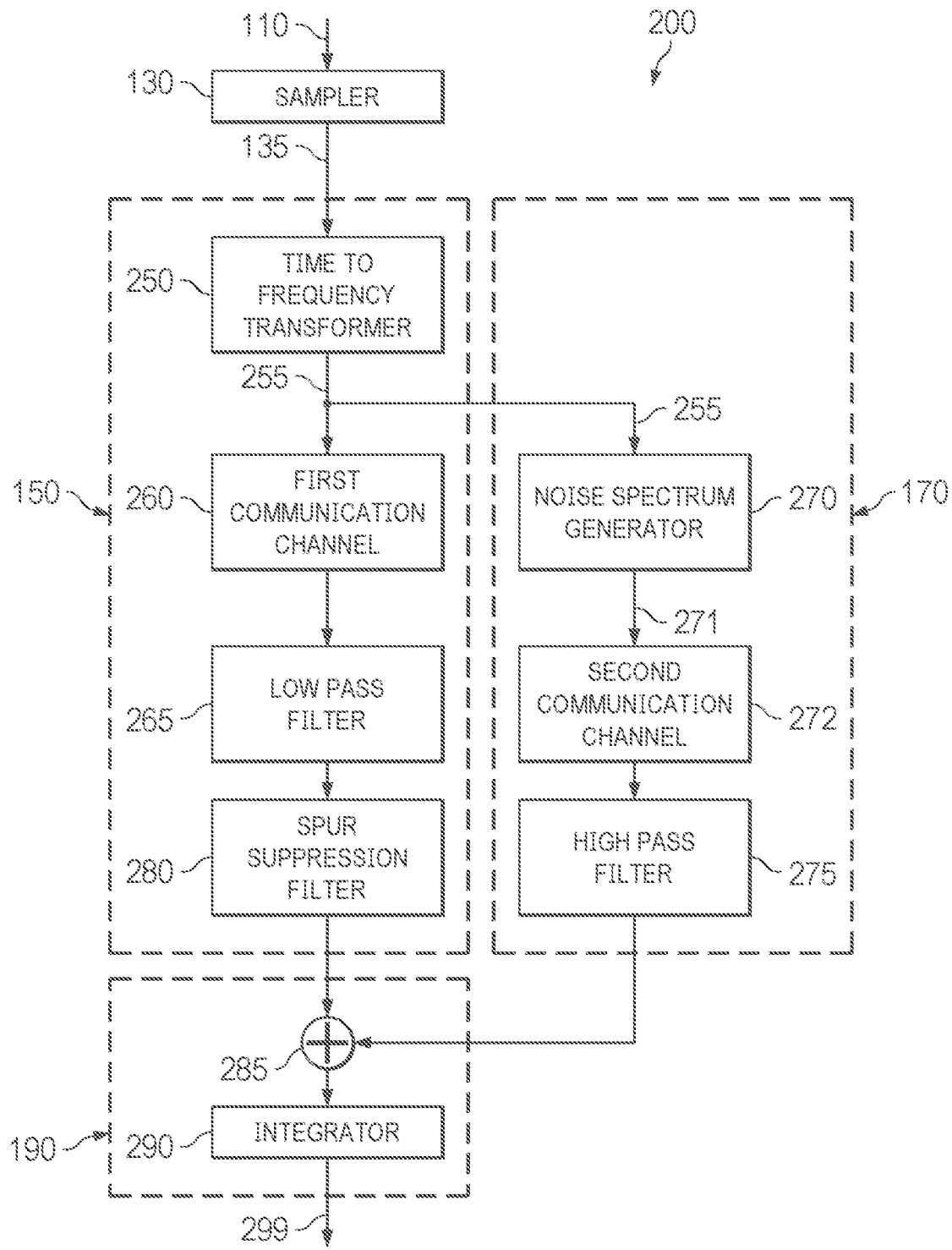
FIG. 2 illustrates a device for measuring phase noise of an input clock in the frequency domain.

FIG. 2 illustrates one of various examples of a device for measurement of phase noise. Device 200 may be a digital signal processor (DSP) where individual components of FIG. 2 may represent specific functions implemented on the DSP. Device 200 may be a microcontroller where individual components of FIG. 2 may represent specific functions implemented on the microcontroller. Device 200 may be a field-programmable gate array (FPGA) where individual components of FIG. 2 may represent specific functions implemented on the FPGA. Device 200 may be a combination of multiple individual computational elements which in combination form the device illustrated in FIG. 2. Device 200 may include a clock input 110. Clock input 110 may receive a clock signal from a phase-locked loop (PLL), delay-locked loop (DLL), or other clock source. Clock input 110 may be sampled by sampler 130. The output of sampler 130 may be sampled clock signal 135. Sampled clock signal 135 may be input to time to frequency transformer 250. Time to frequency transformer 250 may convert the time domain sampled clock signal 135 into frequency domain representation 255. Frequency domain representation 255 may be input to first communication channel 260. First communication channel 260 may be a physical channel, or may be a model of a channel defined by frequency domain response H(s). First communication channel 260 may modify the frequency content of the frequency domain representation 255 consistent with the frequency domain representation H(s). First communication channel 260 may be a model defined by a frequency domain model H(f). First communication channel 260 may modify the frequency content of the frequency domain representation 255 consistent with the frequency domain representation H(f). The output of first communication channel 260 may be input to a low-pass filter 265, defined by an s-domain response $H_1(s)$. Low-pass filter 265 may be defined by a frequency domain response $H_1(f)$. The output of low-pass filter 265 may be input to spur suppression filter 280. Spur suppression filter 280 may filter the input low-pass filtered signal to remove frequency spurs introduced by sampler 130, first communication channel 260, low-pass filter 265, or any spurious content from other sources. Components time to frequency transformer 250, first communication channel 260, low-pass filter 265 and spur suppression filter 280 may comprise input filter 150 as illustrated in FIG. 1.

Frequency domain representation 255 may be input to noise spectrum generator 270. Noise spectrum generator 270 may produce an output noise spectrum 271 with noise magnitude controlled at least partly by the frequency domain representation 255, as detailed in later portions of this specification. The output noise spectrum 271 of the noise spectrum generator 270 may be input to second communication channel 272. Second communication channel 272 may be a physical channel, or may be a model of a channel defined by frequency domain response H(s). Second communication channel 272 may be defined by a frequency domain model H(f). Second communication channel 272 and first communication channel 260 may have identical responses H(s). Second communication channel 272 and first communication channel 260 may have identical responses H(f). The output of second communication channel 272 may be input to high-pass filter 275, defined by a frequency domain response $1-H_1(s)$. High-pass filter 275 may be defined by a frequency domain response $1-H_1(f)$. Components noise spectrum generator 270, second communication channel 272, and high-pass filter 275 may comprise noise generator 170 as illustrated in FIG. 1.

The output of spur suppression filter 280 and the output of high-pass filter 275 respectively may be inputs to adder 285. The output of adder 285 may be input to integrator 290. Integrator 290 may integrate the output of adder 285 over a predetermined frequency bandwidth to determine an integrated phase noise measurement 299. Integrator 290 and adder 285 may comprise combiner 190 of FIG. 1.

Figure 3:
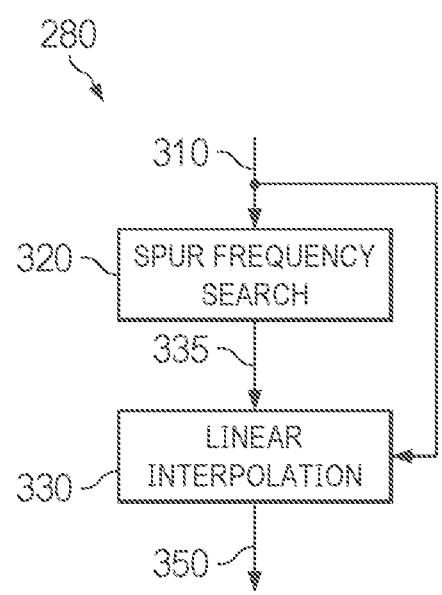
FIG. 3 illustrates a circuit for a spur suppression filter.

FIG. 3 illustrates one of various examples of spur suppression filter 280. Input signal 310 may be input to spur frequency search block 320. Input signal 310 may be the output of low-pass filter 265 of FIG. 2. Spur frequency search block 320 may calculate the location of a spur frequency according to the following method. The spur frequency may be determined based on finding a peak in the frequency spectrum of input signal 310 between a first frequency $f_{spur\_in} - BW_{spur}$ and a second frequency $f_{spur\_in} + BW_{spur}$, where $f_{spur\_in}$ represents the frequency of the sampler 130 of FIG. 1, and $BW_{spur}$ represents a predetermined bandwidth of the spur.

The spur frequency, also referred to as $f_{spur}$, may be input to linear interpolation block 330. Linear interpolation block 330 may suppress harmonics of spur frequency $f_{spur}$ up to a predetermined maximum frequency $f_{max}$ according to the following method. A spur start frequency $f_{start}$ may be defined as $k*f_{spur}-BW_{spur}$, and a spur stop frequency may be defined as $k*f_{spur}+BW_{spur}$, where k may be an integer from 1 to N, where N may be defined as $f_{max}/f_{spur}$. For each value of k from 1 to N, the frequency content of input signal 310 between the spur start frequency and the spur stop frequency may be suppressed according to the following interpolation equation, where I(f) represents the interpolated frequency content at each of the N spur locations, between the spur start frequency and the spur stop frequency:

$$I(f) = I(f_{start}^k) + \left(\frac{I(f_{stop}^k) - I(f_{start}^k)}{f_{stop}^k - f_{start}^k}\right)(f - f_{start}^k)$$

The example of FIG. 3 is one of various examples of spur suppression and is not intended to limit other methods of spur suppression.

Returning to FIG. 2, noise spectrum generator 270 of FIG. 2 may generate a noise signal based on one of various methods. Frequency domain representation 255 may be represented as S(f). S(f) may contain N spectral bins, numbered from bin 0 to bin N−1, and the spectral magnitude of S(f) may be defined as |S(f)|. According to one of various examples, the last M spectral bins (bins N-M to N−1) may be analyzed. Of the last M spectral bins, the K bins with the smallest spectral magnitude are selected. The values of N, M, and K may be predetermined values where N>M and M>K. Array $S_{min}$ may contain the K bins of smallest spectral magnitude, defined as $S_{min}(1)$ to $S_{min}(K)$. The magnitude of output noise spectrum 271 is termed NL, and ma be defined as the average of these K bins of smallest spectral magnitude as follows:

$$NL = \frac{1}{K} * \sum_k S_{min}(k).$$

Figure 4:
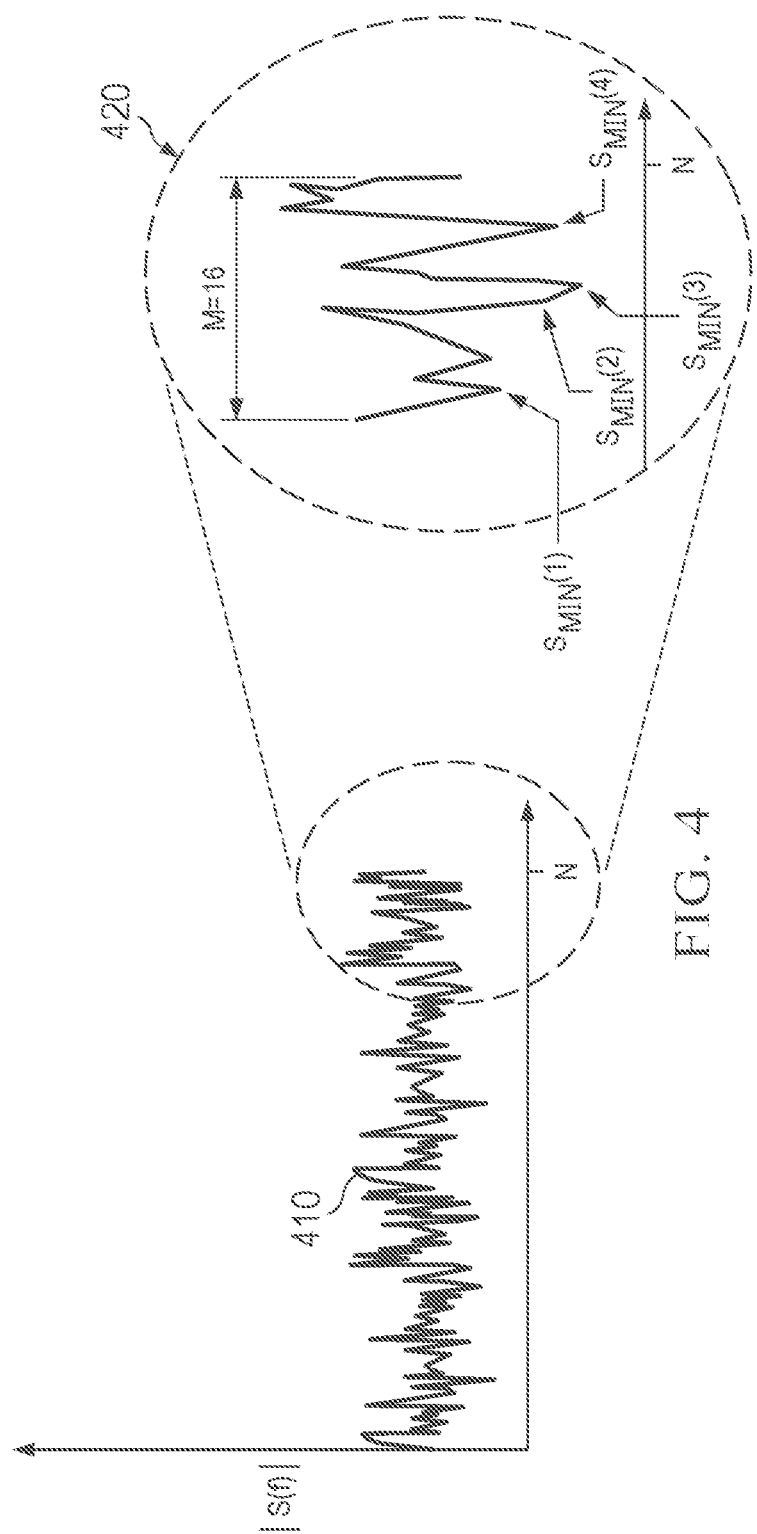
FIG. 4 illustrates a technique for estimating a noise level in the frequency domain.

The generation of the noise spectrum in noise spectrum generator 270 is further illustrated in FIG. 4. Frequency domain representation 255 is illustrated as spectral magnitude 410, with magnitude on the y-axis and spectral bin on the x-axis. For purposes of this illustration, N, the total number of spectral bins, may be 128. This number is not intended to be limiting but is merely for illustration purposes. The shape and magnitude of spectral magnitude 410 is not intended to be limiting and is merely for purposes of illustration. For purposes of this illustration, M may be set to 16. The last M=16 bins of spectral magnitude 410 are illustrated in the exploded portion 420. For purposes of this illustration, K may be set to 4. According to the method previously described, the 4 bins of smallest magnitude are selected from the final 16 bins. The 4 smallest magnitudes are identified as $S_{min}(1)$, $S_{min}(2)$, $S_{min}(3)$, and $S_{min}(4)$. These four magnitude values are used in the previous equation to set the magnitude of the generated noise spectrum:

$$NL = \frac{1}{4} * \sum_k S_{min}(k).$$

Figure 5:
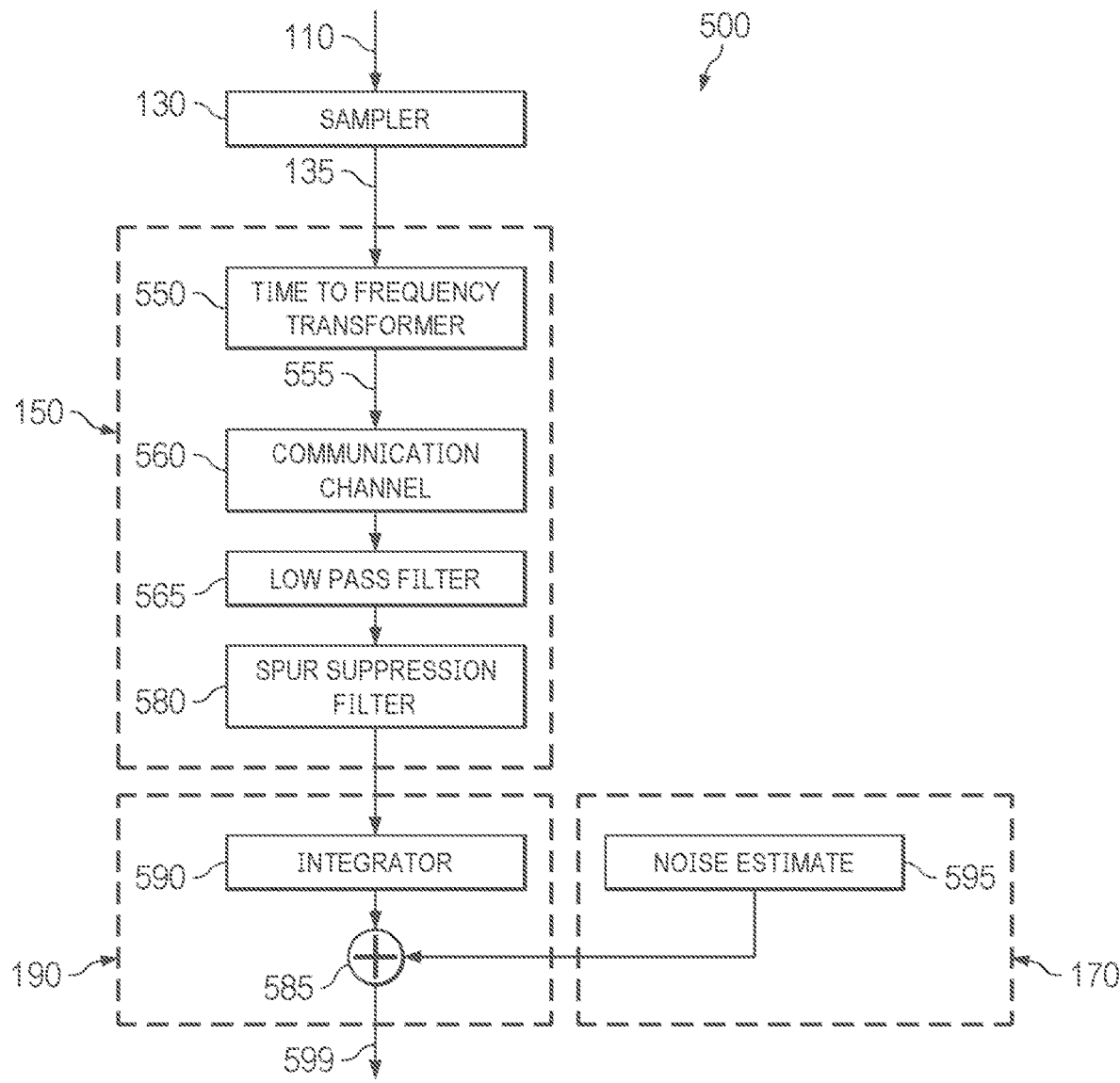
FIG. 5 illustrates an alternative device for measuring phase noise of an input clock signal in the frequency domain.

FIG. 5 illustrates an alternative device for measuring phase noise. Device 500 may be a digital signal processor (DSP) where individual components of FIG. 5 may represent specific functions implemented on the DSP. Device 500 may be a microcontroller where individual components of FIG. 5 may represent specific functions implemented on the microcontroller. Device 500 may be a field-programmable gate array (FPGA) where individual components of FIG. 5 may represent specific functions implemented on the FPGA. Device 500 may be a combination of multiple individual computational elements which in combination form the device illustrated in FIG. 5. Device 500 may have a clock input 110. Clock input 110 may receive a clock signal from a phase-locked loop (PLL), delay-locked loop (DLL), or other clock source. Clock input 110 may be sampled by a sampler 130. The output of sampler 130 may be a sampled clock signal 135. Sampled clock signal 135 may be input to time to frequency transformer 550. Time to frequency transformer 550 may convert sampled clock signal 135 into a frequency domain representation 555. Frequency domain representation 555 may be input to a communication channel 560. Communication channel 560 may be a physical channel, or may be a model of a channel defined by frequency response H(s). Communication channel 560 may modify the frequency content of the frequency domain representation 555 consistent with frequency domain representation H(s). Communication channel 560 may be defined by a frequency domain model H(f). Communication channel 560 may modify the frequency content of the frequency domain representation 555 consistent with frequency domain representation H(f). The output of communication channel 560 may be input to a low-pass filter 565, defined by a frequency domain response $H_1(s)$. Low-pass filter 565 may be defined by a frequency domain response $H_1(f)$. The output of low-pass filter 565 may be input to a spur suppression filter 580. Spur suppression filter 580 may filter the input signal to remove spurs in the signal introduced by sampler 130, by communication channel 560, by low-pass filter 565, or any spurious content from other sources. Integrator 590 may integrate the output of spur suppression filter 580.

Time to frequency transformer 550, communication channel 560, low-pass filter 565 and spur suppression filter 580 may comprise input filter 150 of FIG. 1.

An output of integrator 590 may be one input to an adder 585. Noise estimate 595 may be a second input to adder 585. Output of adder 585 may be integrated phase noise measurement 599. Integrator 590 and adder 585 may comprise combiner 190 of FIG. 1.

The magnitude of the noise estimate 595 may be determined in the frequency domain according to the method illustrated in FIG. 4.

Figure 6:
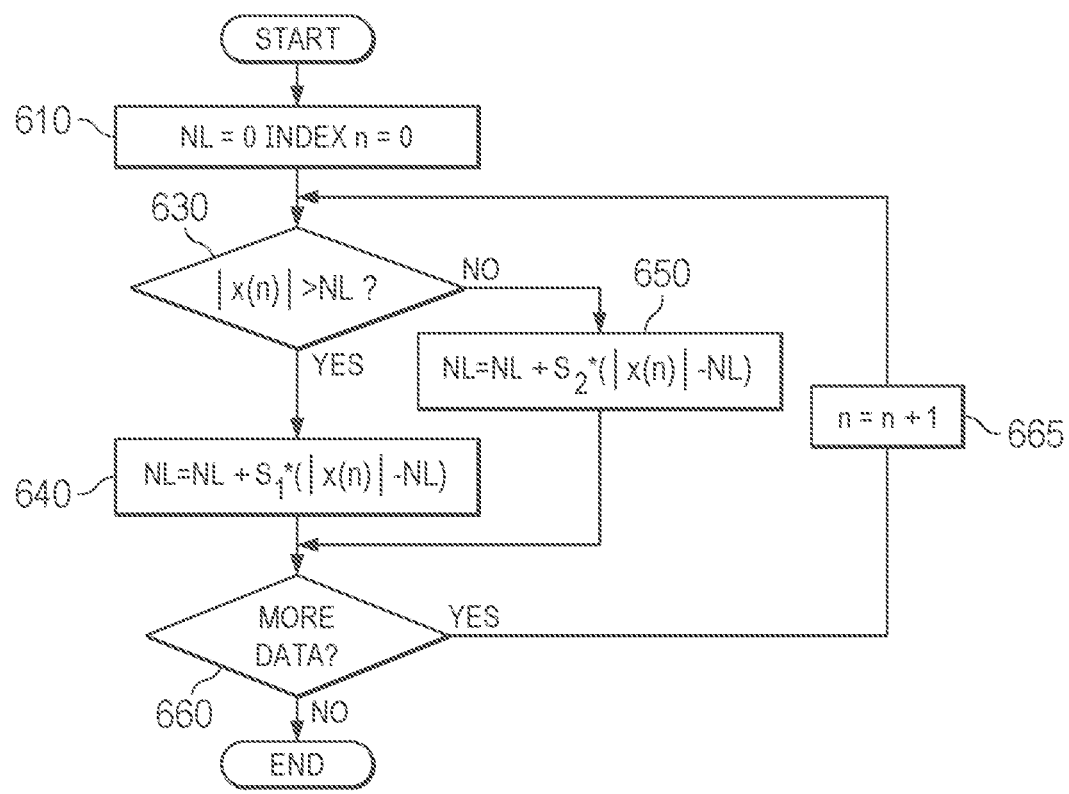
FIG. 6 illustrates a method for estimating a noise level in the time domain.

The magnitude of the noise estimate 595 may be determined in the time domain according to the method illustrated in FIG. 6.

FIG. 6 illustrates a method for determining a noise level NL in the time domain, where NL represents the magnitude of a generated noise signal. At operation 610, a noise level NL may be initialized to zero and index n may be initialized to zero. Input x(n) may be sampled input signal 135. At operation 630, a comparison may be performed between the current sample of input x(n) and the current value of the noise level, NL. If the magnitude of the input signal sample exceeds the magnitude of the noise level, or |x(n)|>NL, the method may proceed to operation 640. At operation 640, the value of the noise level NL may be updated based on the following equation: NL=NL+$s_1$*(|x(n)|−NL). The parameter $s_1$ may be a predetermined value between 0 and 1, which may control the rate of change of the noise level NL. As one of various examples, for a value of $s_1$=0.9, the noise level NL will quickly change to approach the value of |x(n)|, where for a value of $s_1$=0.1 the noise level NL will slowly change to approach the value of |x(n)|. Returning to operation 630, if the magnitude of the input signal sample does not exceed magnitude of the noise level, or |x(n)|; NL, execution moves to operation 650, and the value of the noise level may be updated to a value NL, based on the following equation: NL=NL+$s_2$*(|x(n)|−NL), where (|x(n)|−NL) is thus a negative value. Parameter $s_2$ may be a predetermined value between 0 and 1, which may control the rate of change of the updated noise level, NL. As one of various examples, for a value of $s_2$=0.9, the updated noise level may quickly change to near the value of |x(n)|, where for a value of $s_2$=0.1 the updated noise level may very slowly change to approach the value of |x(n)|.

In one of various examples, $s_2$ may be set to a value much larger than $s_1$, and the noise level may decrease much faster than it will increase. The values of $s_1$ and $s_2$ may be set to enable a particular rate of increase and decrease in the noise level, NL, as the input magnitude |x(n)| changes.

At operation 660, if there is more data to process, the method returns to operation 620 and the next sample of x(n) is analyzed. If there is no more data to process, the method ends and the noise level may not update further.

Figure 7:
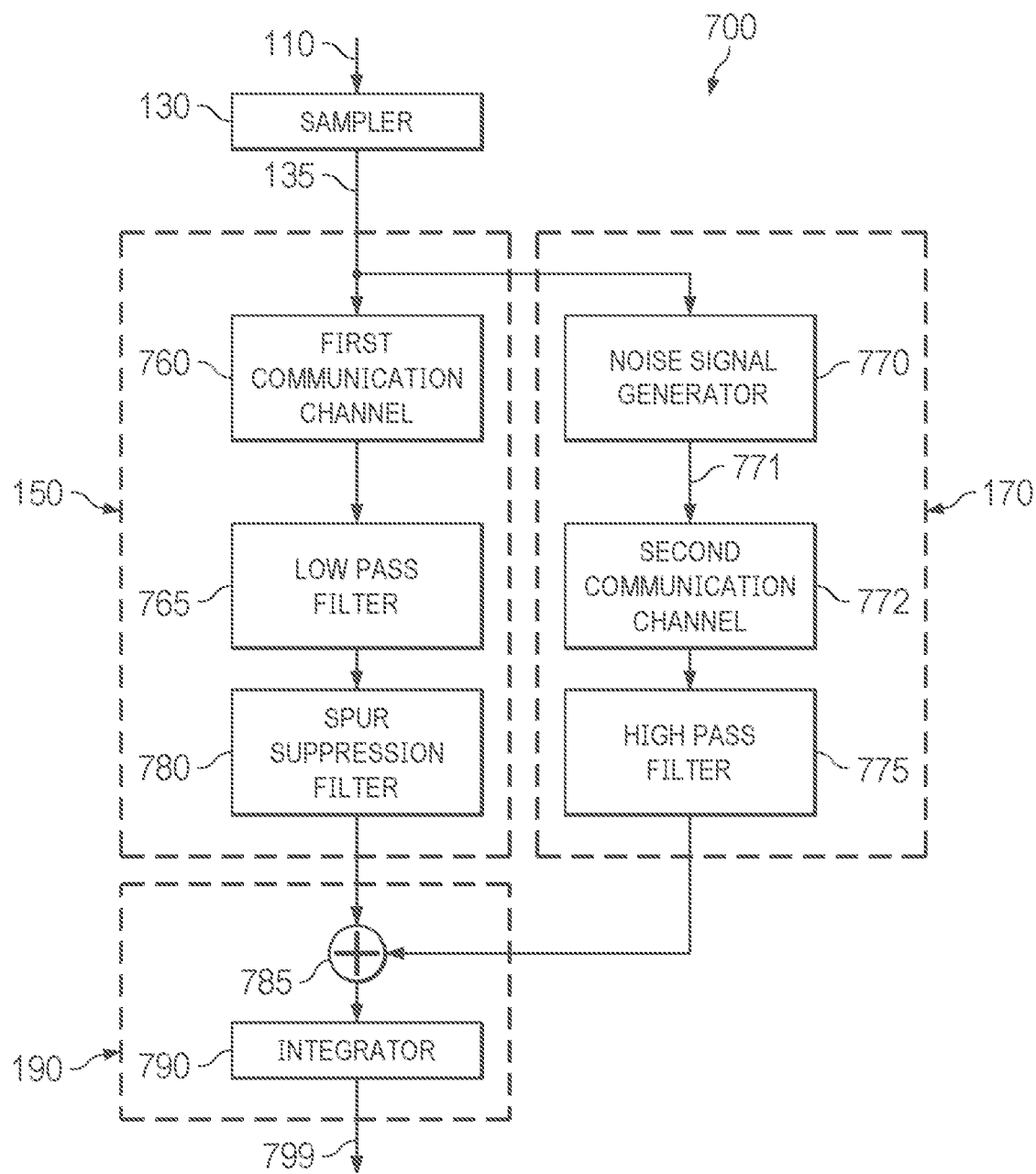
FIG. 7 illustrates a device for measuring phase noise of an input clock in the time domain.

FIG. 7 illustrates one of various examples of a device for measurement of phase noise in the time domain. Device 700 may be a digital signal processor (DSP) where individual components of FIG. 7 may represent specific functions implemented on the DSP. Device 700 may be a microcontroller where individual components of FIG. 7 may represent specific functions implemented on the microcontroller. Device 700 may be a field-programmable gate array (FPGA) where individual components of FIG. 7 may represent specific functions implemented on the FPGA. Device 700 may be a combination of multiple individual computational elements which in combination form the device illustrated in FIG. 7. Device 700 may include a clock input 110. Clock input 110 may receive a clock signal from a phase-locked loop (PLL), delay-locked loop (DLL), or other clock source. Clock input 110 may be sampled by sampler 130. The output of sampler 130 may be sampled clock signal 135. Sampled clock signal 135 may be input to first communication channel 760. First communication channel 760 may be a physical channel, or may be a model of a channel defined by time domain response h(t). First communication channel 760 may modify the content of sampled clock signal 135 consistent with the time domain representation h(t). The output of first communication channel 760 may be input to a low-pass filter 765, defined by a time domain response $h_1$(t). The output of low-pass filter 765 may be input to spur suppression filter 780. Spur suppression filter 780 may filter the input low-pass filtered signal to remove frequency spurs introduced by sampler 130, first communication channel 760, low-pass filter 765, or any spurious content from other sources. Components first communication channel 760, low-pass filter 765 and spur suppression filter 780 may comprise input filter 150 as illustrated in FIG. 1.

Sampled clock signal 135 may be input to noise signal generator 770. Noise signal generator 770 may produce an output noise signal 771 with noise magnitude controlled at least partly by sampled clock signal 135. The output noise signal 771 of the noise signal generator 770 may be input to second communication channel 772. Second communication channel 772 may be a physical channel, or may be a model of a channel defined by time domain response h(t). Second communication channel 772 and first communication channel 760 may have identical responses h(t). The output of second communication channel 772 may be input to high-pass filter 775, defined by a time domain response 1−$h_1$(t). Components noise signal generator 770, second communication channel 772, and high-pass filter 775 may comprise noise generator 170 as illustrated in FIG. 1.

Spur suppression filter 780 may suppress spurs in the low-pass filter output as described in previous portions of this disclosure. Spur suppression filter 780 may suppress spurs in the low-pass filter output by another method.

Noise signal generator 770 may generate a noise signal as described in previous portions of this disclosure. Noise signal generator 770 may generate a noise signal by another method.

The output of spur suppression filter 780 and the output of high-pass filter 775 respectively may be inputs to adder 785. The output of adder 785 may be input to integrator 790. Integrator 790 may integrate the output of adder 785 over a predetermined period to determine an integrated phase noise measurement 799.

Figure 8:
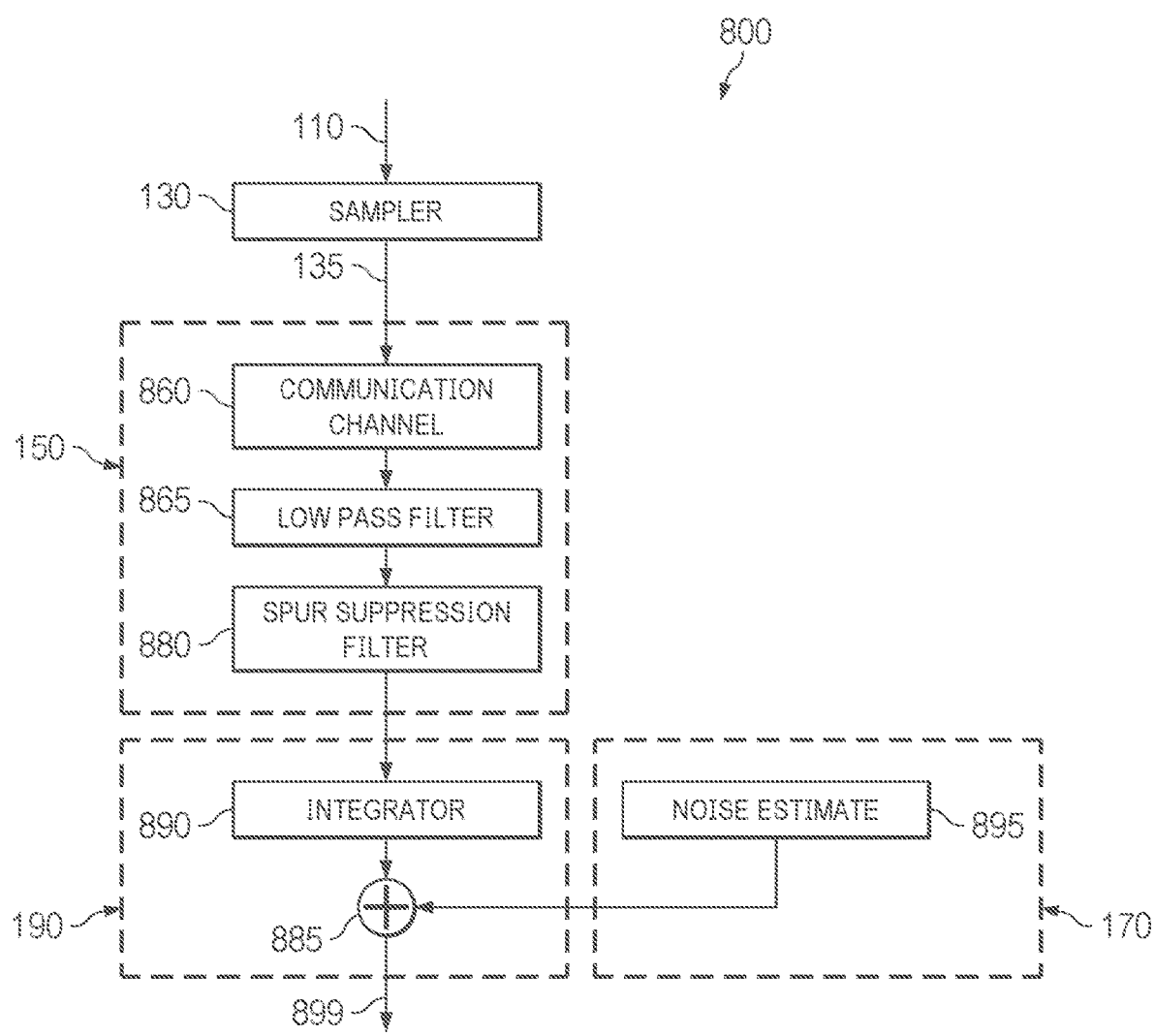
FIG. 8 illustrates an alternative device for measuring phase noise of an input clock in the time domain.

FIG. 8 illustrates an alternative device for measuring phase noise in the time domain. Device 800 may be a digital signal processor (DSP) where individual components of FIG. 8 may represent specific functions implemented on the DSP. Device 800 may be a microcontroller where individual components of FIG. 8 may represent specific functions implemented on the microcontroller. Device 800 may be a field-programmable gate array (FPGA) where individual components of FIG. 8 may represent specific functions implemented on the FPGA. Device 800 may be a combination of multiple individual computational elements which in combination form the device illustrated in FIG. 8. Device 800 may have a clock input 110. Clock input 110 may receive a clock signal from a phase-locked loop (PLL), delay-locked loop (DLL), or other clock source. Clock input 110 may be sampled by a sampler 130. The output of sampler 130 may be a sampled clock signal 135. Sampled clock signal 135 may be input to communication channel 860. Communication channel 860 may be a physical channel, or may be a model of a channel defined by time domain response h(t). Communication channel 860 may modify the content of the sampled clock signal 135 consistent with time domain representation h(t). The output of communication channel 860 may be input to a low-pass filter 865, defined by a time domain response $h_1$(t). The output of low-pass filter 865 may be input to a spur suppression filter 880. Spur suppression filter 880 may filter the input signal to remove spurs in the signal introduced by sampler 130, by communication channel 860, by low-pass filter 865, or any spurious content from other sources. Integrator 890 may integrate the output of spur suppression filter 880.

An output of integrator 890 may be one input to an adder 885. Noise estimate 895 may be a second input to adder 885. Output of adder 885 may be integrated phase noise measurement 599.

The magnitude of the noise estimate 895 may be determined in the frequency domain according to the method illustrated in FIG. 4.

The magnitude of the noise estimate 895 may be determined in the time domain according to the method illustrated in FIG. 6.

Although examples have been described above, other variations and examples may be made from this disclosure without departing from the spirit and scope of these disclosed examples.

The invention claimed is:

1. A device comprising:
   a sampler to sample an input signal;
   an input filter to receive an input from the sampler;
   a noise generator to generate a noise signal; and,
   a combiner to receive input from, respectively, the input filter and the noise generator, the combiner to perform an integration function and to output an integrated noise output measurement.

2. The device as claimed in claim 1, the input filter comprising:
   a time-to-frequency domain transformer to receive the sampled input signal and to generate a first and a second output signal at least partly as a result of the received sampled input signal;
   a first communication channel to receive the first output signal from the time-to-frequency domain transformer;
   a low-pass filter to receive an output signal from the first channel communication channel; and,
   a spur suppression filter to receive an output signal from the low-pass filter, the spur suppression filter to output a signal to the combiner.

3. The device as claimed in claim 2, wherein the spur suppression filter to suppress the output of the low-pass filter at calculated spur frequency locations.

4. The device as claimed in claim 2, the noise generator comprising:
   a noise spectrum generator to receive the second output signal from the time-to-frequency domain transformer;
   a second communication channel to receive an output from the noise spectrum generator; and,
   a high-pass filter to receive an output from the second communication channel, the high-pass filter to output a signal to the combiner.

5. The device as claimed in claim 4, wherein the noise spectrum generator outputs a noise spectrum based at least partly on the amplitude of a predetermined number of bins in the spectrum of the second output signal of the time to frequency transformer.

6. The device as claimed in claim 4, wherein the noise spectrum generator outputs a noise spectrum based at least on an average spectral magnitude of a predetermined number of bins in the output signal of the time to frequency transformer output.

7. The device as claimed in claim 4, the combiner comprising:
   a summer to receive, respectively, the output signal from the spur suppression filter and the output signal from the high-pass filter and to generate a summation signal; and,
   an integrator to receive the summation signal from the summer, the integrator to output an integrated phase noise measurement.

8. The device as claimed in claim 2, the combiner comprising:
   an integrator to receive an output of the spur suppression filter; and,
   a summer to receive, at a first input, an output signal from the integrator and to receive, at a second input, a noise estimate signal from the noise generator, the summer to generate an integrated noise measurement at the summer output.

9. The device as claimed in claim 8, wherein the noise estimate signal is based on the average spectral magnitude of a predetermined number of bins in the frequency domain representation of the sampled input signal.

10. The device as claimed in claim 1, the input filter comprising:
    a first communication channel to receive the sampled input signal;
    a low-pass filter to receive an output signal from the first channel communication channel; and,
    a spur suppression filter to receive an output signal from the low-pass filter, the spur suppression filter to output a signal to the combiner.

11. The device as claimed in claim 10, wherein the spur suppression filter to suppress the output of the low-pass filter at calculated spur frequency locations.

12. The device as claimed in claim 10, the noise generator comprising:
    a noise generator to generate a noise signal;
    a second communication channel to receive an output from the noise generator; and,
    a high-pass filter to receive an output from the second communication channel, the high-pass filter to output a signal to the combiner.

13. The device as claimed in claim 12, wherein the noise generator outputs a noise signal based at least partly on the amplitude of the sampled input signal.

14. The device as claimed in claim 12, the combiner comprising:
    a summer to receive, respectively, the output signal from the spur suppression filter and the output signal from the high-pass filter and to generate a summation signal; and,
    an integrator to receive the summation signal from the summer, the integrator to output an integrated phase noise measurement.

15. A device as claimed in claim 10, the combiner comprising:
    an integrator to receive an output of the spur suppression filter; and,
    a summer to receive at a first input an output signal from the integrator and second input from a noise estimate signal of the noise generator, the summer to generate an integrated noise measurement at the summer output.

16. The device as claimed in claim 15, wherein the noise estimate signal is based on a predetermined number of samples of the sampled input signal.

17. A method comprising:
    sampling an input signal to generate a sampled input signal;
    filtering the sampled input signal to generate a filtered input signal;
    generating a noise signal; and,
    combining the filtered input signal and the noise signal to generate an integrated noise output, the combining comprising an integration function.

18. The method as claimed in claim 17, wherein filtering the sampled input signal comprises:
    transforming the sampled input signal from the time domain to the frequency domain thereby generating a frequency domain representation of the sampled input signal;
    passing the frequency domain representation of the sampled input signal through a first communication channel;
    filtering the output of the first communication channel with a low-pass filter to generate a low-frequency filtered signal; and,
    suppressing spurs in the low-frequency filtered signal with a spur suppression filter.

19. The method as claimed in claim 18, wherein the spur suppression filter suppresses the low-frequency filtered signal at calculated spur frequency locations.

20. The method as claimed in claim 18, wherein generating a noise signal comprises:
generating a noise signal, based at least partly on the frequency domain representation of the sampled input signal;
passing the frequency domain representation of the sampled input signal through a second communication channel; and,
filtering the output of the second communication channel with a high-pass filter to generate a high-frequency filtered signal.

21. The method as claimed in claim 20, wherein generating a noise signal comprises generating a noise estimate based on the average spectral magnitude of a predetermined number of bins in the frequency domain representation of the sampled input signal and passing the noise estimate through a communication channel and filtering the output of the communication channel with a high-pass filter.

22. The method as claimed in claim 20, wherein the combining a comprises:
summing the output of the spur suppression filter and the high-frequency filtered signal, thereby generating a summation signal; and,
integrating the summation signal to calculate an integrated noise measurement output.

23. The method as claimed in claim 18, wherein the combining a comprises:
integrating the output of the spur suppression filter; and,
summing, respectively, an output signal from the integrator and a noise estimate signal from the noise generator at a summer, the summer to generate an integrated noise measurement at the summer output.

24. The method as claimed in claim 23, wherein the noise estimate signal is based on the average spectral magnitude of a predetermined number of bins in the frequency domain representation of the sampled input signal.

25. The method as claimed in claim 17, wherein filtering the sampled input signal comprises:
passing the sampled input signal through a first communication channel;
filtering the output of the first communication channel with a low-pass filter to generate a low-frequency filtered signal; and,
suppressing spurs in the low-frequency filtered signal with a spur suppression filter.

26. The method as claimed in claim 25, wherein the spur suppression filter suppresses the low-frequency filtered signal at calculated spur frequency locations.

27. The method as claimed in claim 25, wherein generating a noise signal comprises:
generating a noise signal, based at least partly on the samples the sampled input signal;
passing the noise signal through a second communication channel; and,
filtering the output of the second communication channel with a high-pass filter to generate a high-frequency filtered signal.

28. A method as claimed in claim 27, wherein generating a noise signal comprises generating a noise estimate based on the amplitude of individual samples of the sampled input signal.

29. A method as claimed in claim 27, wherein the combining a comprises:
summing the output of the spur suppression filter and the high-frequency filtered signal, thereby generating a summation signal; and,
integrating the summation signal to calculate an integrated noise measurement output.

30. A method as claimed in claim 25, wherein the combining a comprises:
integrating the output of the spur suppression filter; and,
summing, respectively, an output signal from the integrator and a noise estimate signal at a summer, the summer to generate an integrated noise measurement at the summer output.

31. The method as claimed in claim 30, wherein the noise estimate signal is based on a predetermined number of samples of the sampled input signal.

* * * * *